US012588207B2

(12) United States Patent
Jung et al.

(10) Patent No.: US 12,588,207 B2
(45) Date of Patent: Mar. 24, 2026

(54) SEMICONDUCTOR DEVICE INCLUDING CHANNEL STRUCTURES AND A SLIT STRUCTURE

(71) Applicant: SK hynix Inc., Icheon-si (KR)

(72) Inventors: Sung Wook Jung, Icheon-si (KR); Jong Hun Kim, Icheon-si (KR); Byung Soo Park, Icheon-si (KR); Sang Bum Lee, Icheon-si (KR); Song Hee Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 371 days.

(21) Appl. No.: 18/339,857

(22) Filed: Jun. 22, 2023

(65) Prior Publication Data

US 2024/0292615 A1 Aug. 29, 2024

(30) Foreign Application Priority Data

Feb. 23, 2023 (KR) ........................ 10-2023-0024307

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 43/35; H10B 41/30; H10B 41/50; H10B 43/30; H10B 43/50; H01L 23/5283
See application file for complete search history.

(56) References Cited

U.S. PATENT DOCUMENTS

| | | | | |
|---|---|---|---|---|
| 9,786,673 | B1 * | 10/2017 | Cho ........................ | H01L 23/528 |
| 9,929,174 | B1 * | 3/2018 | Mizutani ................ | H10B 43/10 |
| 10,727,245 | B2 | 7/2020 | Xu et al. | |
| 10,825,934 | B2 * | 11/2020 | Kwon .................... | H10B 43/10 |
| 11,145,594 | B2 * | 10/2021 | Park ....................... | H10B 41/10 |

(Continued)

FOREIGN PATENT DOCUMENTS

| | | | | | |
|---|---|---|---|---|---|
| CN | 110197830 | A | * | 9/2019 | ............. H10B 43/27 |
| CN | 110767657 | A | * | 2/2020 | ....... H01L 21/76805 |

(Continued)

*Primary Examiner* — Scott B Geyer
(74) *Attorney, Agent, or Firm* — WILLIAM PARK AND ASSOCIATES LTD.

(57) ABSTRACT

A semiconductor device includes a gate structure including a cell region and a contact region, a slit structure configured to extend in a first direction through the gate structure, first channel structures disposed in the cell region of the gate structure, and second channel structures disposed in the cell region of the gate structure and disposed to be more adjacent to the contact region of the gate structure than the first channel structures. In a second direction that intersects the first direction, the first channel structures may be spaced apart from the slit structure by a first distance, and the second channel structures may be spaced apart from the slit structure at a second distance.

16 Claims, 15 Drawing Sheets

(56) References Cited

U.S. PATENT DOCUMENTS

| | | | | |
|---|---|---|---|---|
| 11,991,880 | B2 * | 5/2024 | Lu | H10B 43/35 |
| 2016/0086969 | A1 * | 3/2016 | Zhang | H01L 21/02365 257/314 |
| 2017/0025434 | A1 * | 1/2017 | Nakajima | H01L 21/31116 |
| 2018/0019257 | A1 * | 1/2018 | Son | H10B 43/30 |
| 2018/0130814 | A1 * | 5/2018 | Lee | H10B 43/27 |
| 2019/0081064 | A1 * | 3/2019 | Nakaki | H10D 62/393 |
| 2019/0172794 | A1 * | 6/2019 | Ito | H10B 43/35 |
| 2019/0280004 | A1 * | 9/2019 | Takamura | H10B 43/10 |
| 2020/0083246 | A1 * | 3/2020 | Inatsuka | H10D 30/0275 |
| 2020/0119031 | A1 * | 4/2020 | Shen | H10B 41/35 |
| 2020/0135753 | A1 * | 4/2020 | Zhang | H10B 43/10 |
| 2020/0152654 | A1 * | 5/2020 | Hwang | H10B 41/20 |
| 2020/0295027 | A1 * | 9/2020 | Sakata | H10B 43/27 |
| 2020/0303396 | A1 * | 9/2020 | Minemura | G11C 16/24 |
| 2021/0167076 | A1 * | 6/2021 | Xu | H01L 23/5226 |
| 2021/0296345 | A1 * | 9/2021 | Wang | H10B 43/50 |
| 2021/0305271 | A1 * | 9/2021 | Kim | H10B 43/10 |
| 2021/0305273 | A1 * | 9/2021 | Lee | H10B 43/10 |
| 2022/0093756 | A1 * | 3/2022 | Lee | H10D 62/292 |
| 2022/0285389 | A1 * | 9/2022 | Fukuda | H10B 41/10 |
| 2022/0336437 | A1 * | 10/2022 | Kim | H10D 89/10 |
| 2022/0406805 | A1 * | 12/2022 | Yang | H10B 41/27 |
| 2023/0085996 | A1 * | 3/2023 | Huang | H10B 41/10 257/314 |
| 2023/0165000 | A1 * | 5/2023 | Choi | G11C 5/06 |
| 2023/0301098 | A1 * | 9/2023 | Jung | H10B 43/10 |
| 2024/0170389 | A1 * | 5/2024 | Wu | H10B 43/10 |

FOREIGN PATENT DOCUMENTS

| | | | | | |
|---|---|---|---|---|---|
| CN | 112420724 | A | * | 2/2021 | H10B 43/27 |
| CN | 112652628 | A | * | 4/2021 | H10B 43/35 |
| CN | 114388530 | A | * | 4/2022 | H10B 43/35 |
| CN | 114551454 | A | * | 5/2022 | H10B 41/30 |
| CN | 115472618 | A | * | 12/2022 | H10D 30/69 |
| KR | 20150033932 | A | * | 4/2015 | H10D 30/693 |
| KR | 1020170038513 | A | | 4/2017 | |
| KR | 20200032595 | A | * | 3/2020 | H01L 27/11551 |
| KR | 20200038138 | A | * | 4/2020 | H01L 21/768 |

* cited by examiner

SEMICONDUCTOR DEVICE INCLUDING CHANNEL STRUCTURES AND A SLIT STRUCTURE

CROSS-REFERENCE TO RELATED APPLICATION

This application claims priority under 35 U.S.C. § 119 (a) to Korean Patent Application No. 10-2023-0024307 filed on Feb. 23, 2023, in the Korean Intellectual Property Office, which is incorporated herein by reference in its entirety.

BACKGROUND

1. Technical Field

Embodiments generally relate to an electronic device and a method of manufacturing an electronic device and, more particularly, to a semiconductor device and a method of manufacturing a semiconductor device.

2. Related Art

The degree of integration of semiconductor devices is basically determined by the area that is occupied by a unit memory cell. As the improvement of the degree of integration of semiconductor devices in which a memory cell is formed on a substrate as a single layer reaches its limit, a three-dimensional semiconductor device in which memory cells are stacked on a substrate is proposed. Furthermore, to improve operation reliability of such a semiconductor device, various structures and manufacturing methods are developed.

SUMMARY

In an embodiment, a semiconductor device may include a gate structure including a cell region and a contact region, a slit structure configured to extend in a first direction through the gate structure, first channel structures disposed in the cell region of the gate structure, and second channel structures disposed in the cell region of the gate structure and disposed to be more adjacent to the contact region of the gate structure than the first channel structures. In a second direction that intersects the first direction, the first channel structures may be spaced apart from the slit structure by a first distance, and the second channel structures may be spaced apart from the slit structure at a second distance, the second distance is greater than the first distance.

In an embodiment, a semiconductor device may include a first gate structure, first channel structures and second channel structures disposed within the first gate structure, a second gate structure disposed on the first gate structure, third channel structures disposed within the second gate structure and connected to the first channel structures, fourth channel structures disposed within the second gate structure and connected to the second channel structures, and a slit structure disposed within the first gate structure and the second gate structure and configured to extend in a first direction. In a second direction that intersects the first direction, the first channel structures may be spaced apart from the slit structure by a first distance, and the second channel structures may be spaced apart from the slit structure by a second distance that is greater than the first distance.

In an embodiment, a method of manufacturing a semiconductor device may include forming a stack, forming first channel structures that extend through the stack, forming second channel structures that extend through the stack, and forming, within the stack, a slit structure that extends in a first direction. In a second direction that intersects the first direction, the first channel structures may be spaced apart from the slit structure by a first distance, and the second channel structures may be spaced apart from the slit structure by a second distance that is greater than the first distance.

In an embodiment, a method of manufacturing a semiconductor device may include forming a first stack, forming first openings and second openings within the first stack, forming a second stack on the first stack, forming, within the second stack, third openings connected to the first openings, forming, within the second stack, fourth openings connected to the second openings, and forming, within the first stack and the second stack, a slit that extends in a first direction. In a second direction that intersects the first direction, the first openings may be spaced apart from the slit by a first distance, and the second openings may be spaced apart from the slit by a second distance, the second distance is greater than the first distance.

BRIEF DESCRIPTION OF THE DRAWINGS

FIGS. 5A, 5B, 5C, and 5D are diagrams for describing a method of manufacturing a semiconductor device according to an embodiment of the present disclosure.

DETAILED DESCRIPTION

Hereinafter, embodiments according to the technical spirit of the present disclosure are described with reference to the accompanying drawings.

Embodiments of the present disclosure may provide a semiconductor device having a stable structure and improved characteristics and a method of manufacturing a semiconductor device.

Various embodiments of the present technology can provide a semiconductor device having a stable structure and improved reliability.

Figure 1A:
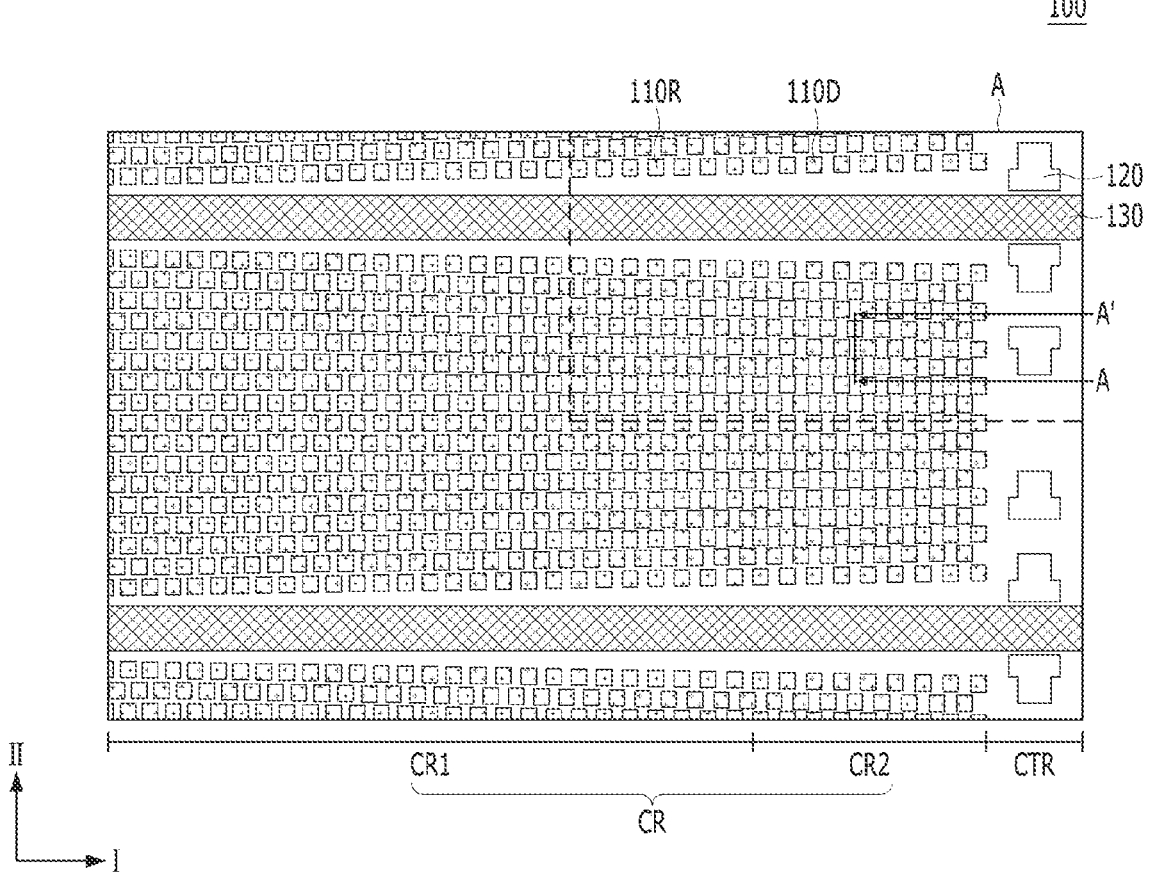
FIGS. 1A, 1B, and 1C are diagrams for describing a semiconductor device according to an embodiment of the present disclosure.
Figure 1B:
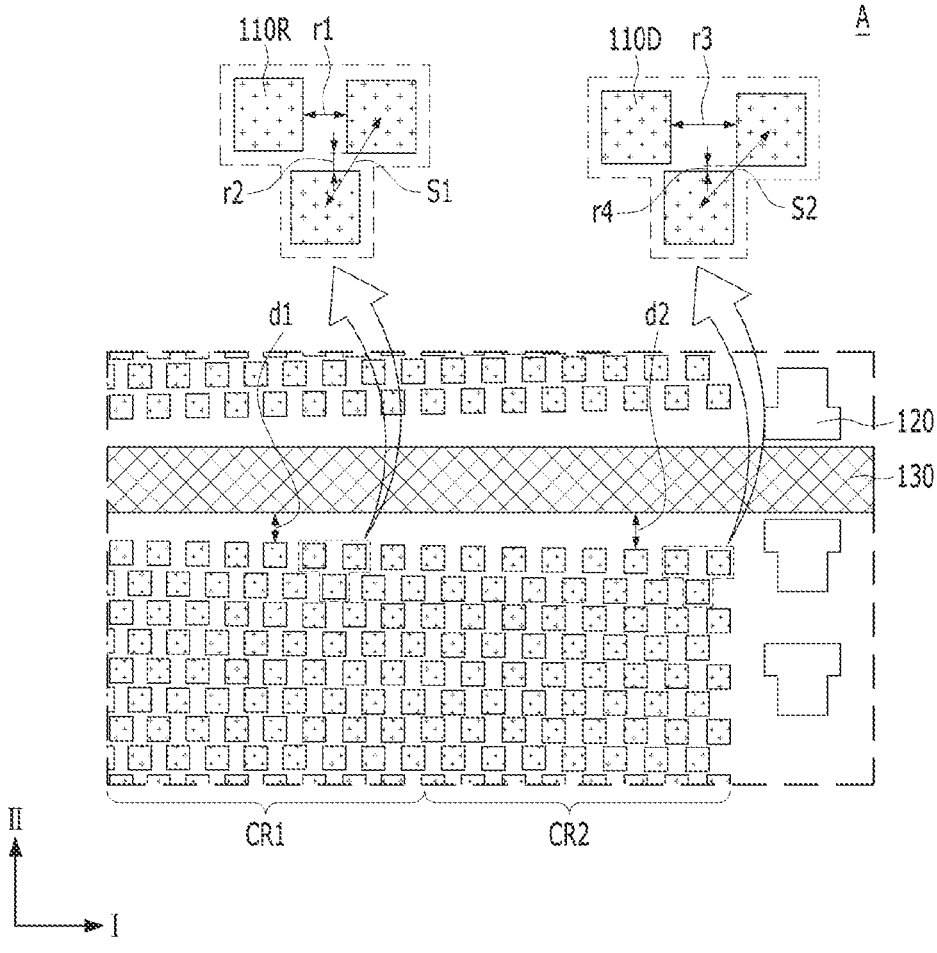
Figure 1C:
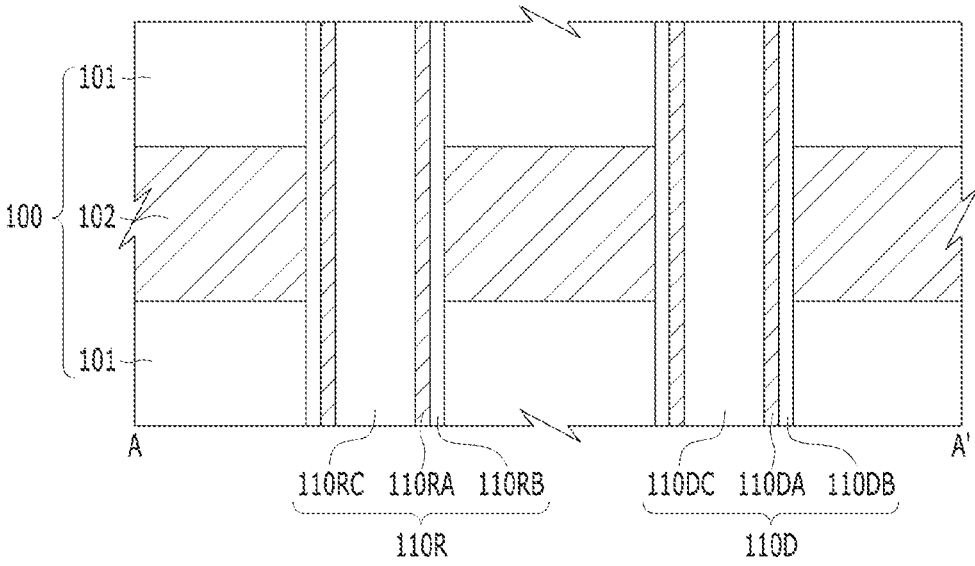

FIGS. 1A to 1C are diagrams for describing a semiconductor device according to an embodiment of the present disclosure. FIG. 1B may be an enlarged view of A in FIG. 1A. FIG. 1C may be a cross-sectional view of a first channel structure 110R and a second channel structure 110D.

Referring to FIGS. 1A and 1B, the semiconductor device may include a gate structure 100, the first channel structures 110R, the second channel structures 110D, or slit structures 130 or may include the gate structure 100, the first channel structures 110R, the second channel structures 110D, or the slit structures 130 in combination. The semiconductor device may further include supports 120.

The gate structure 100 may include a cell region CR and a contact region CTR. The cell region CR may include a first region CR1 and a second region CR2. The second region CR2 may be disposed closer to the contact region CTR than the first region CR1. The channel structures 110R and 110D may be disposed in the cell region CR. The supports 120 or contact plugs may be disposed in the contact region CTR. In other words, different structures may be disposed in the cell region CR and the contact region CTR, respectively, on the basis of a boundary surface between the cell region CR and the contact region CTR, but the present disclosure is not limited thereto. The supports 120 or the contact plugs may be disposed in the cell region CR, and the channel structures 110R and 110D may be disposed in the contact region CTR. The gate structure 100 may include insulating layers 101 and conductive layers 102 that are alternately stacked. In this case, the insulating layers 101 may include an insulating material, such as oxide. The conductive layers 102 may include a conductive material, such as tungsten. The conductive layers 102 may each be a word line or a selection line.

The slit structures 130 may be disposed within the gate structure 100. The slit structures 130 may extend in a first direction I through the gate structure 100. For example, the slit structures 130 may extend from the cell region CR to the contact region CTR. The slit structures 130 may be disposed in a second direction II that intersects the first direction I by being spaced apart from each other. The slit structures 130 may include an insulating material or a conductive material or may include the insulating material or the conductive material in combination.

The first channel structures 110R may be disposed in the cell region CR of the gate structure 100. For example, the first channel structures 110R may be disposed in the first region CR1. The second channel structures 110D may be disposed in the cell region CR of the gate structure 100, and may be disposed to be more adjacent to the contact region CTR of the gate structure 100 than the first channel structures 110R. For example, the second channel structures 110D may be disposed in the second region CR2.

The first channel structures 110R may each include a channel layer 110RA. The first channel structures 110R may each further include a memory layer 110RB that surrounds the sidewall of the channel layer 110RA or an insulating core 110RC within the channel layer 110RA or may each further include the memory layer 110RB or the insulating core 110RC in combination. The second channel structures 110D may each include a channel layer 110DA, a memory layer 110DB, or an insulating core 110DC or may each include the channel layer 110DA, the memory layer 110DB, or the insulating core 110DC in combination. Memory cells may be stacked along the channel structures 110R and 110D.

The second channel structures 110D may be disposed closer to the contact region CTR than the first channel structures 110R. A distance between the first channel structures 110R or the second channel structures 110D and the slit structure 130 may be increased as the first channel structures 110R or the second channel structures 110D become closer to the contact region CTR. For example, in the second direction II, the first channel structures 110R may be spaced apart from the slit structure 130 by a first distance "d1". In the second direction II, the second channel structures 110D may be spaced apart from the slit structure 130 by a second distance "d2". The first distance "d1" may be substantially the same as or different from the second distance "d2". For example, the second distance "d2" may be greater than the first distance "d1".

The form of the slit structure 130 may be influenced by a surrounding environment. If the pattern density of the cell region CR and the pattern density of the contact region CTR are different from each other, the slit structure 130 may be deformed at a boundary between the cell region CR and the contact region CTR at which the pattern density is changed. The term "pattern density" may mean a degree of distribution of structures (patterns) located in region. For example, a first pattern density may mean the degree of distribution of the first channel structures 110R located in the first region CR1, and a second pattern density may mean the degree of distribution of the second channel structures 110D located in the second region CR2. The term "degree of distribution" may mean distance between at least two structures (patterns) or may mean average of distances between two or more structures (patterns). The slit structure 130 may be inclined or some region of the slit structure 130 may protrude. Accordingly, in an embodiment, the distance between channel structures 110R and 110D and the slit structure 130 may be adjusted so that the deformation of the slit structure 130 attributable to a change in the surrounding pattern is minimized.

In an embodiment, a change in the form of the slit structure 130 in the boundary surface between the cell region CR and the contact region CTR can be prevented or reduced because the distance between the second channel structures 110D and the slit structure 130 is increased in the second direction II as the second channel structures 110D become closer to the contact region CTR. For example, if the second distance "d2" is substantially the same as the first distance "d1", a form of the slit structure 130 may be changed. However, a change in the form of the slit structure 130 can be reduced because the second channel structures 110D are disposed so that the second distance "d2" is greater than the first distance "d1".

The first channel structures 110R may be spaced apart from each other at a first interval "r1" in the first direction I, and may be spaced apart from each other at a second interval "r2" in the second direction II. The second channel structures 110D may be spaced apart from each other at a third interval "r3" in the first direction I, and may be spaced apart from each other at a fourth interval "r4" in the second direction II. The first interval "r1" and the third interval "r3" may be substantially the same or different from each other. The second interval "r2" and the fourth interval "r4" may be substantially the same or different from each other.

The number of channel rows of the first channel structures 110R and the number of channel rows of the second channel structures 110D may be substantially the same or different from each other. In this case, the channel row may include the channel structures 110R and 110D that are arranged in the first direction I. If the second distance "d2" is greater than the first distance "d1", the interval between the channel rows of the second channel structures 110D may be reduced. Accordingly, the fourth interval "r4" may be smaller than the second interval "r2".

Furthermore, in order to compensate for a difference between the pattern densities of the first region CR1 and the second region CR2 according to a difference between the second interval "r2" and the fourth interval "r4", the third interval "r3" may be greater than the first interval "r1". Accordingly, a first diagonal line distance S1 between the first channel structures 110R and a second diagonal line distance S2 between the second channel structures 110D may be substantially the same. Furthermore, the pattern density of the first channel structures 110R and the pattern density of the second channel structures 110D may be maintained to be substantially identical to each other.

The channel structures 110R and 110D may each be a real channel structure or a dummy channel structure. The real channel structure and the dummy channel structure may have similar structures, but electrical connection states of the real channel structure and the dummy channel structure may be different from each other. The real channel structure may be connected between a source line and a bit line. Memory cells that are stacked along the real channel structure may be real memory cells that store data. The dummy channel structure may have an electrically floated state. Memory cells that are stacked along the dummy channel structure may be dummy memory cells in which data is not stored. In an embodiment, memory cells that are stacked along the dummy channel structure may be dummy memory cells in which data is unable to be stored.

For example, the first channel structures 110R may each be a real channel structure, and the second channel structures 110D may each be a dummy channel structure. In this case, a distance between the first channel structures 110R and the slit structure 130 may be substantially the same, but the present disclosure is not limited thereto. The distance between the first channel structures 110R and the slit structure 130 may be increased as the first channel structures 110R become closer to the contact region CTR. Furthermore, a distance between the second channel structures 110D and the slit structure 130 may be increased as the second channel structures 110D become closer to the contact region CTR.

As another example, the first channel structures 110R and the second channel structures 110D may each be a dummy channel structure. In this case, a distance between the first channel structures 110R and the slit structure 130 may be increased as the first channel structures 110R become closer to the contact region CTR. Furthermore, a distance between the second channel structures 110D and the slit structure 130 may be increased as the second channel structures 110D become closer to the contact region CTR.

However, the present disclosure is not limited to the examples. The first channel structures 110R and the second channel structures 110D may each be a real channel structure. A distance between the first channel structures 110R and the slit structure 130 may be substantially the same. A distance between the second channel structures 110D and the slit structure 130 may be increased as the second channel structures 110D become closer to the contact region CTR. Alternatively, the distance between the first channel structures 110R and the slit structure 130 may be increased as the first channel structures 110R becomes closer to the contact region CTR. The distance between the second channel structures 110D and the slit structure 130 may be increased as the second channel structures 110D become closer to the contact region CTR.

According to an aforementioned structure, the second distance "d2" between the second channel structures 110D and the slit structure 130 in the second direction II may be increased as the second channel structures 110D become closer to the contact region CTR. As the second distance "d2" is increased, the fourth interval "r4" between the second channel structures 110D in the second direction II may be reduced. In order to compensate for the reduction in the distance, the third interval "r3" between the second channel structures 110D in the first direction I may be increased. Accordingly, in an embodiment, although the second distance "d2" is increased, the pattern density of the second channel structures 110D can be maintained. Furthermore, in an embodiment, a change in the form of the slit structure 130 at the boundary surface between the cell region CR and the contact region CTR can be prevented or reduced.

Figure 2A:
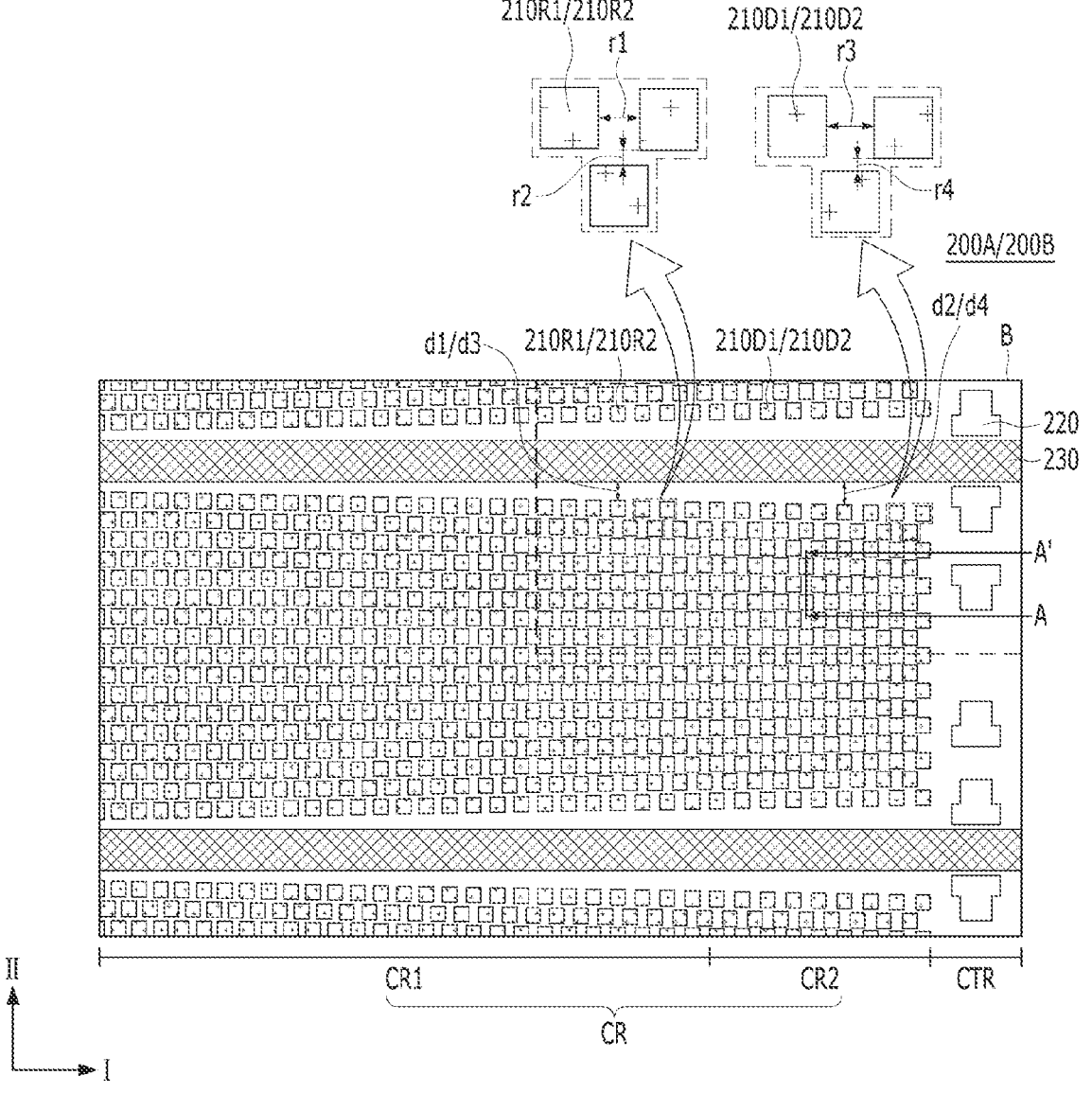
FIGS. 2A and 2B are diagrams for describing a semiconductor device according to an embodiment of the present disclosure.
Figure 2B:
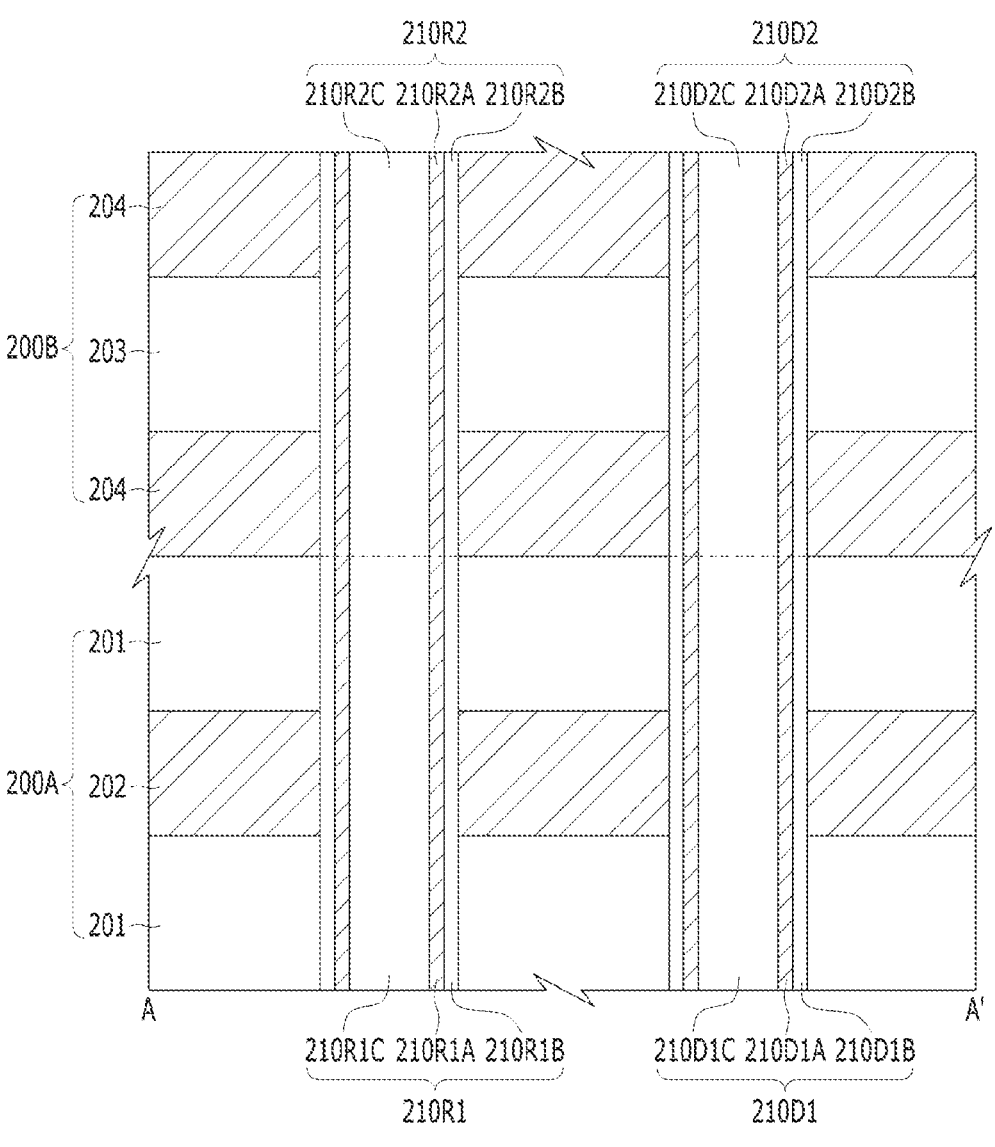

FIGS. 2A and 2B are diagrams for describing a semiconductor device according to an embodiment of the present disclosure. FIG. 2A may be a plan view of a cell region CR and a contact region CTR. FIG. 2B may be a cross-sectional view of a first channel structure 210R1, a second channel structure 210D1, a third channel structure 210R2, and a fourth channel structure 210D2. Hereinafter, a description of contents that are redundant with aforementioned contents will be omitted.

Referring to FIGS. 2A and 2B, the semiconductor device may include a first gate structure 200A, a second gate structure 200B, the first channel structures 210R1, the second channel structures 210D1, the third channel structures 210R2, the fourth channel structures 210D2, supports 220, or slit structures 230 or may include the first gate structure 200A, the second gate structure 200B, the first channel structures 210R1, the second channel structures 210D1, the third channel structures 210R2, the fourth channel structures 210D2, the supports 220, or the slit structures 230 in combination.

The first gate structure 200A and the second gate structure 200B may each include the cell region CR and the contact region CTR. The cell region CR may include a first region CR1 and a second region CR2. The second region CR2 may be disposed closer to the contact region CTR than the first region CR1. The second gate structure 200B may be disposed on the first gate structure 200A. The first gate structure 200A may include first insulating layers 201 and first conductive layers 202 that are alternately stacked. The second gate structure 200B may include second insulating layers 203 and second conductive layers 204 that are alternately stacked.

The slit structures 230 may be disposed within the first gate structure 200A and the second gate structure 200B, and may extend in a first direction I. For example, the slit structures 230 may extend from the cell region CR to the contact region CTR.

The first channel structures 210R1 and the second channel structures 210D1 may be disposed within the first gate structure 200A. For example, the first channel structures 210R1 or the second channel structures 210D1 may be disposed in the cell region CR. The first channel structures 210R1 may be disposed in the first region CR1. The second channel structures 210D1 may be disposed in the second region CR2.

The first channel structures 210R1 may each include a first channel layer 210R1A, a first memory layer 210R1B, or a first insulating core 210R1C or may each include the first channel layer 210R1A, the first memory layer 210R1B or the first insulating core 210R1C in combination. The second channel structures 210D1 may each include a second channel layer 210D1A, a second memory layer 210D1B, or a second insulating core 210D1C or may each include the second channel layer 210D1A, the second memory layer 210D1B, or the second insulating core 210D1C in combination.

The third channel structures 210R2 and the fourth channel structures 210D2 may be disposed within the second gate structure 200B. For example, the third channel structures 210R2 or the fourth channel structures 210D2 may be disposed in the cell region CR. The third channel structures 210R2 may be connected to the first channel structures 210R1. The fourth channel structures 210D2 may be connected to the second channel structures 210D1. The third channel structures 210R2 may each include the third channel layer 210R2A, the third memory layer 210R2B, or the third insulating core 210R2C or may each include the third channel layer 210R2A, the third memory layer 210R2B, or the third insulating core 210R2C in combination. The fourth channel structures 210D2 may each include the fourth channel layer 210D2A, the fourth memory layer 210D2B, or the fourth insulating core 210D2C or may each include the fourth channel layer 210D2A, the fourth memory layer 210D2B, or the fourth insulating core 210D2C in combination.

The first channel structure 210R1 and the third channel structure 210R2 may be interconnected and may form one channel structure. For example, a portion that belongs to a channel structure and that is disposed within the first gate structure 200A may be the first channel structure 210R1. A portion that belongs to the channel structure and that is disposed within the second gate structure 200B may be the third channel structure 210R2. Memory cells that are stacked along the first channel structure 210R1 and memory cells that are stacked along the third channel structure 210R2 may constitute one memory string.

The second channel structure 210D1 and the fourth channel structure 210D2 may be interconnected, and may form one channel structure. For example, a portion that belongs to a channel structure and that is disposed within the first gate structure 200A may be the second channel structure 210D1. A portion that belongs to the channel structure and that is disposed within the second gate structure 200B may be the fourth channel structure 210D2. Memory cells that are stacked along the second channel structure 210D1 and memory cells that are stacked along the fourth channel structure 210D2 may constitute one memory string.

The distance between the first channel structures 210R1 and the slit structure 230 may be substantially the same as the distance between the third channel structures 210R2 and the slit structure 230. For example, in the second direction II, the first channel structures 210R1 may be spaced apart from the slit structure 230 by a first distance "d1", and the third channel structures 210R2 may be spaced apart from the slit structure 230 by a third distance "d3". Accordingly, the third channel structures 210R2 and the first channel structures 210R1 may be aligned and disposed, but the present disclosure is not limited thereto. The distance between the first channel structures 210R1 and the slit structure 230 may be greater than the distance between the third channel structures 210R2 and the slit structure 230. In such a case, the third channel structures 210R2 and the first channel structures 210R1 may be offset and disposed.

The distance between the second channel structures 210D1 and the slit structure 230 may be substantially the same as the distance between the fourth channel structures 210D2 and the slit structure 230. For example, in the second direction II, the second channel structures 210D1 may be spaced apart from the slit structure 230 by a second distance "d2", and the fourth channel structures 210D2 may be spaced apart from the slit structure 230 by a fourth distance "d4". Accordingly, the second channel structures 210D1 and the fourth channel structures 210D2 may be aligned and disposed, but the present disclosure is not limited thereto. The distance between the second channel structures 210D1 and the slit structure 230 may be greater than the distance between the fourth channel structures 210D2 and the slit structure 230. For example, in the second direction II, the fourth distance "d4" is smaller than the second distance "d2". Therefore, the second channel structures 210D1 and the fourth channel structures 210D2 may be offset and disposed.

A distance between the first channel structures 210R1 and the slit structure 230 may be increased as the first channel structures 210R1 become closer to the contact region CTR. Furthermore, a distance between the second channel structures 210D1 and the slit structure 230 may be increased as the second channel structures 210D1 become closer to the contact region CTR. A distance between the third channel structures 210R2 and the slit structure 230 may be increased as the third channel structures 210R2 become closer to the contact region CTR. A distance between the fourth channel structures 210D2 and the slit structure 230 may be increased as the fourth channel structures 210D2 become closer to the contact region CTR. For example, the third distance "d3" may be substantially the same as or different from the fourth distance "d4". The fourth distance "d4" may be greater than the third distance "d3."

According to an aforementioned structure, the arrangement of the first channel structures 210R1 and the second channel structures 210D1 that are disposed within the first gate structure 200A and the arrangement of the third channel structures 210R2 and the fourth channel structures 210D2 that are disposed within the second gate structure 200B may be substantially the same. For example, the first channel structures 210R1 may be spaced apart from each other at a first interval "r1" in the first direction I, and also the third channel structures 210R2 may be spaced apart from each other at the first interval "r1" in the first direction I. The first channel structures 210R1 may be spaced apart from each other at a second interval "r2" in the second direction II, and also the third channel structures 210R2 may be spaced apart from each other at the second interval "r2" in the second direction II. And, the second channel structures 210D1 may be spaced apart from each other at a third interval "r3" in the first direction I, and also the fourth channel structures 210D2 may be spaced apart from each other at the third interval "r3" in the first direction I. The second channel structures 210D1 may be spaced apart from each other at a fourth interval "r4" in the second direction II, and also the fourth channel structures 210D2 may be spaced apart from each other at the fourth interval "r4" in the second direction II. Furthermore, pattern density of the third channel structures 210R2 and the pattern density of the fourth channel structures 210D2 may be maintained to be substantially identical to each other.

The distance between the first channel structures 210R1 and the slit structure 230 and the distance between the second channel structures 210D1 and the slit structure 230 may be increased as the first channel structures 210R1 and the second channel structures 210D1 become closer to the contact region CTR. Similarly, in the second gate structure 200B, the distance between the third channel structures 210R2 and the slit structure 230 and the distance between the fourth channel structures 210D2 and the slit structure 230 may be increased as the third channel structures 210R2 and the fourth channel structures 210D2 become closer to the contact region CTR. Accordingly, in an embodiment, a change in the form of the slit structure 230 at a boundary surface between the cell region CR and the contact region CTR can be prevented or reduced.

FIGS. 3A to 3D are diagrams for describing a semiconductor device according to an embodiment of the present disclosure.

Figure 3A:
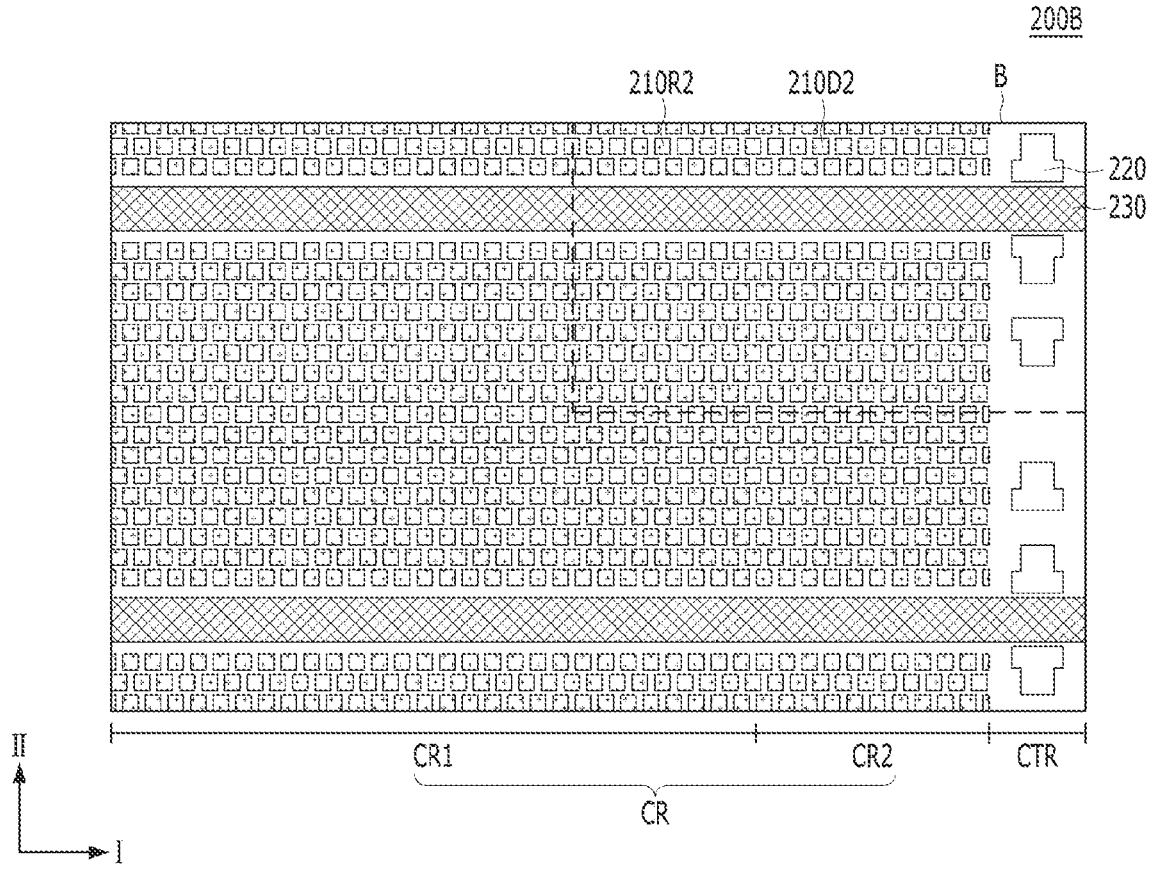
FIGS. 3A, 3B, 3C, and 3D are diagrams for describing a semiconductor device according to an embodiment of the present disclosure.
Figure 3B:
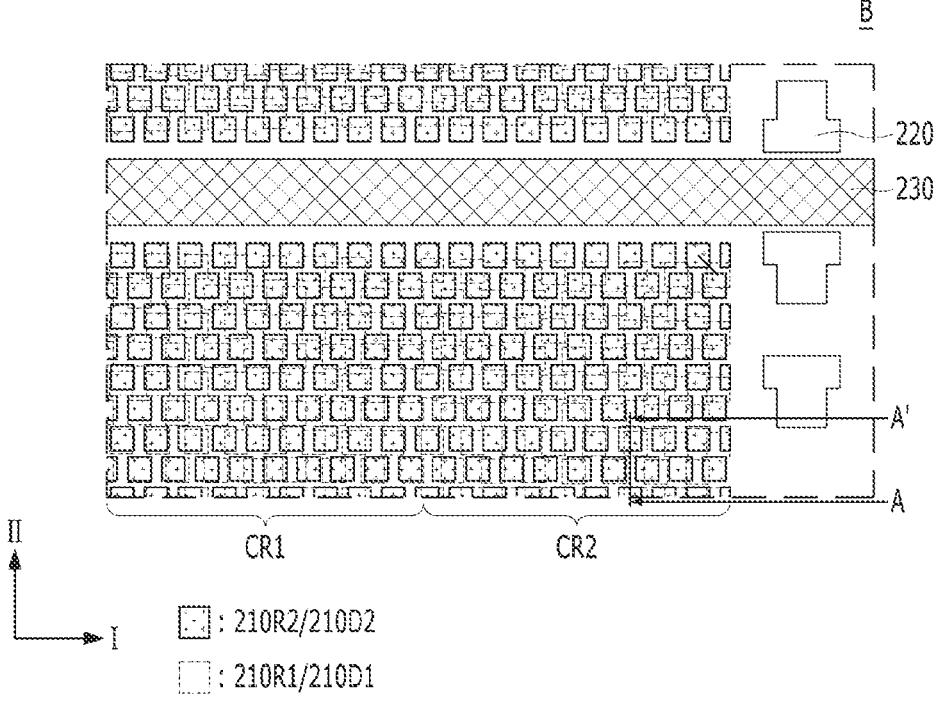

FIG. 3A may be a plan view of the semiconductor device. FIG. 3B may be an enlarged view of B in FIG. 3A. FIGS.

3C and 3D may be cross-sectional views of the first channel structure 210R1, the second channel structure 210D1, the third channel structure 210R2, and the fourth channel structure 210D2. Hereinafter, a description of contents that are redundant with aforementioned contents will be omitted.

Referring to FIGS. 3A to 3D, the semiconductor device may include the first gate structure 200A, the second gate structure 200B, the first channel structures 210R1, the second channel structures 210D1, the third channel structures 210R2, the fourth channel structures 210D2, the supports 220, or the slit structures 230 or may include the first gate structure 200A, the second gate structure 200B, the first channel structures 210R1, the second channel structures 210D1, the third channel structures 210R2, the fourth channel structures 210D2, the supports 220, or the slit structures 230 in combination.

The third channel structures 210R2 and the fourth channel structures 210D2 may be disposed in the cell region CR of the second gate structure 200B. The distance between the third channel structures 210R2 and the slit structure 230 and the distance between the fourth channel structures 210D2 and the slit structure 230 may be constant. For example, the distance between the channel structures 210R2 and 210D2 and the slit structure 230 may be constant regardless of the cell region CR or the contact region CTR.

For reference, locations, arrangements, and forms of the first gate structure 200A that is disposed under the second gate structure 200B and the first channel structures 210R1 and the second channel structures 210D1 that are disposed in the cell region CR of the first gate structure 200A may be similar to those that have been described with reference to FIGS. 2A and 2B. The distance between the first channel structures 210R1 and the slit structure 230 and the distance between the second channel structures 210D1 and the slit structure 230 may be increased as the first channel structures 210R1 and the second channel structures 210D1 become closer to the contact region CTR. Accordingly, the channel structures 210R2 and 210D2 of the second gate structure 200B and the channel structures 210R1 and 210D1 of the first gate structure 200A may be offset and disposed.

Figure 3C:
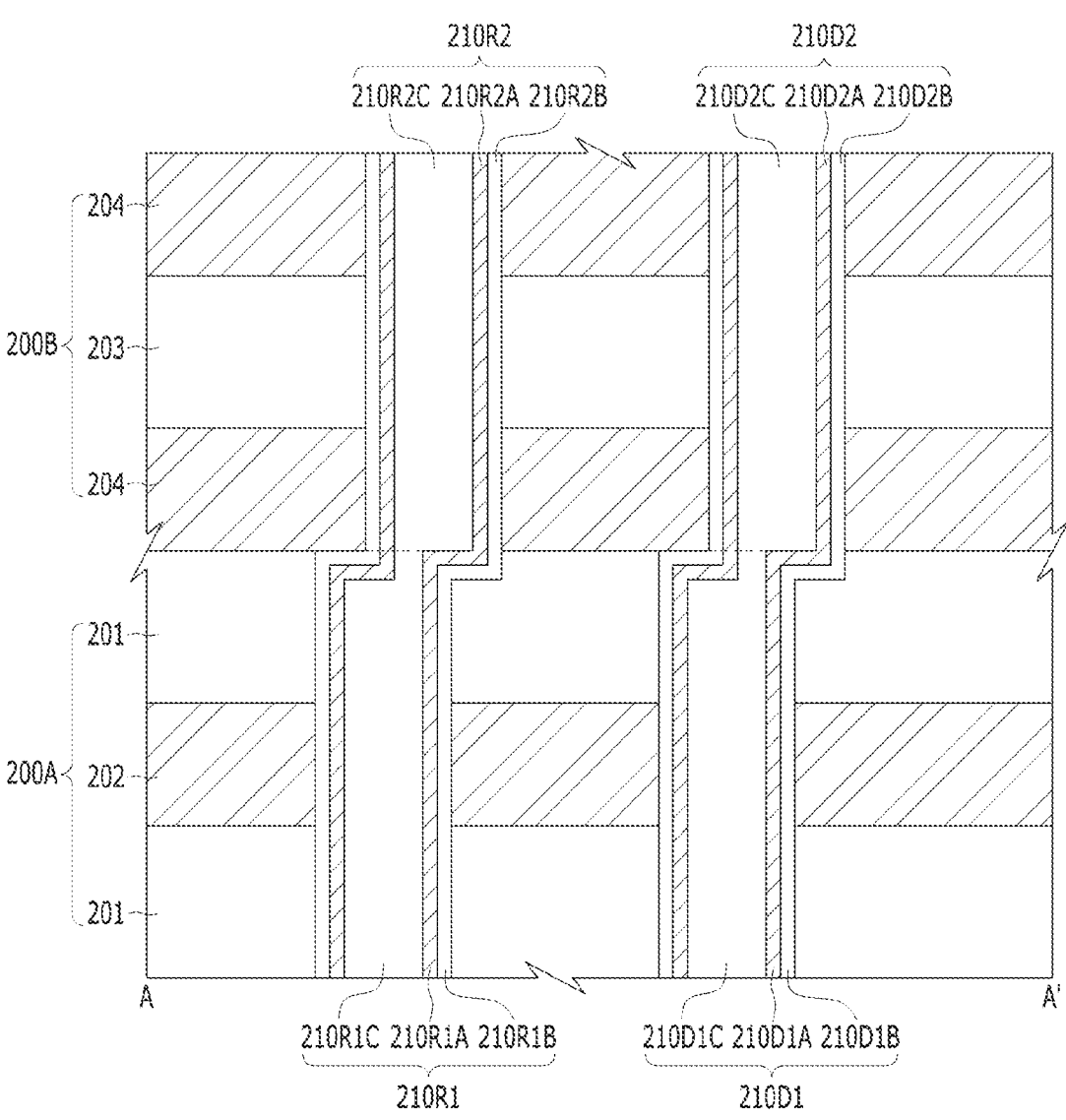

Referring to FIG. 3C, the first channel structures 210R1 and the third channel structures 210R2 may be offset and disposed, and may be interconnected through overlapped portions of the first channel structures 210R1 and the third channel structures 210R2. The second channel structures 210D1 and the fourth channel structures 210D2 may be offset and disposed, and may be interconnected through overlapped portions of the second channel structures 210D1 and the fourth channel structures 210D2.

Figure 3D:
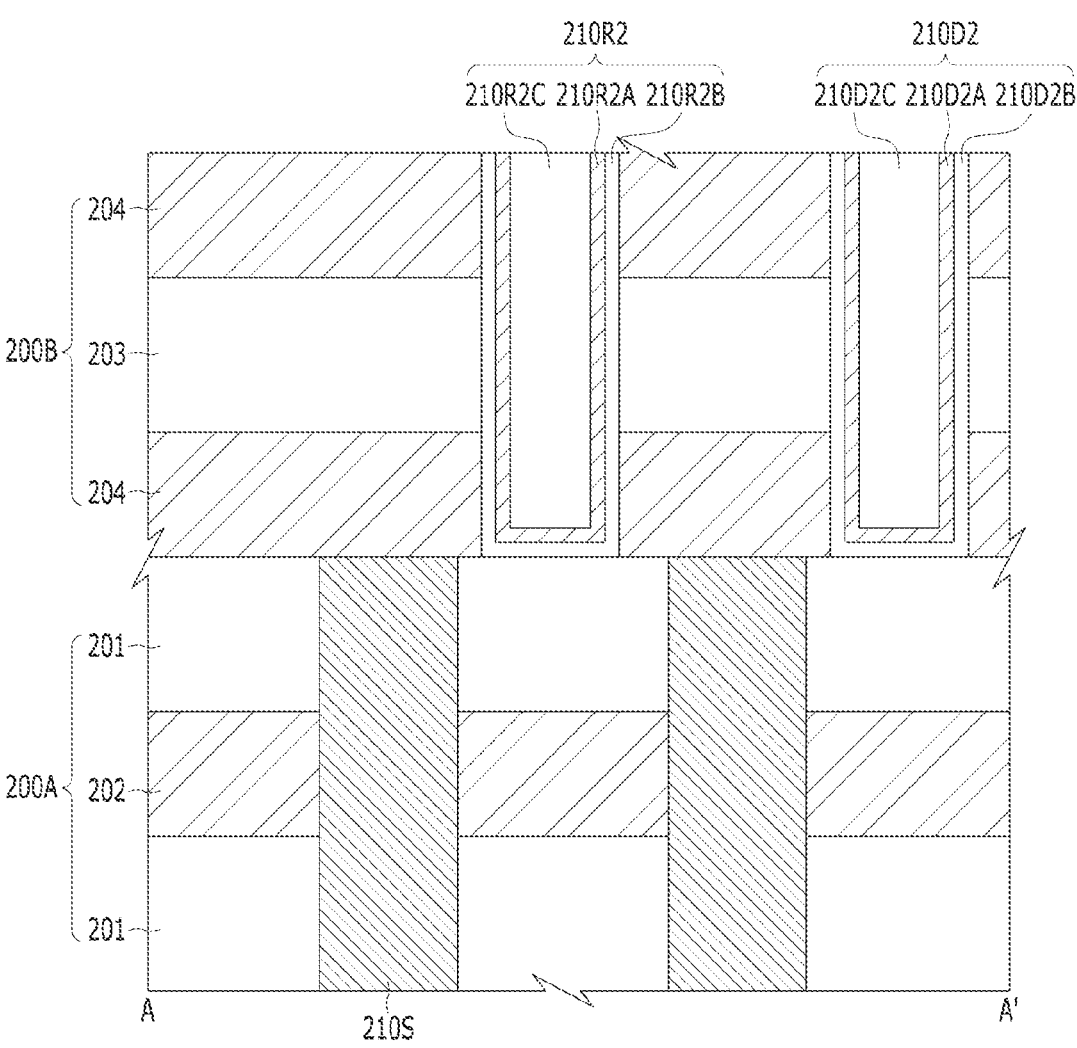

Referring to FIG. 3D, a sacrificial layer 210S may be disposed within the first gate structure 200A. The third channel structures 210R2 and the fourth channel structures 210D2 may be disposed within the second gate structure 200B. That is, the sacrificial layers 210S may be disposed within the first gate structure 200A instead of the first channel structures 210R1 and the second channel structures 210D1. The sacrificial layers 210S may be offset and disposed so that the sacrificial layers 210S do not overlap the third channel structure 210R2 and the fourth channel structure 210D2. The sacrificial layers 210S may remain without being replaced with the first channel structure 210R1 or the second channel structure 210D1 in a process of manufacturing the semiconductor device.

According to an aforementioned structure, the arrangement of the first channel structures 210R1 and the second channel structures 210D1 that are disposed within the first gate structure 200A and the arrangement of the third channel structures 210R2 and the fourth channel structures 210D2 that are disposed within the second gate structure 200B may be different from each other. The distance between the channel structures 210R1 and 210D1 and the slit structure 230 within the first gate structure 200A may be increased as the channel structures 210R1 and 210D1 become closer to the contact region CTR. The distance between the channel structures 210R2 and 210D2 and the slit structure 230 within the second gate structure 200B may be constant.

Figure 4:
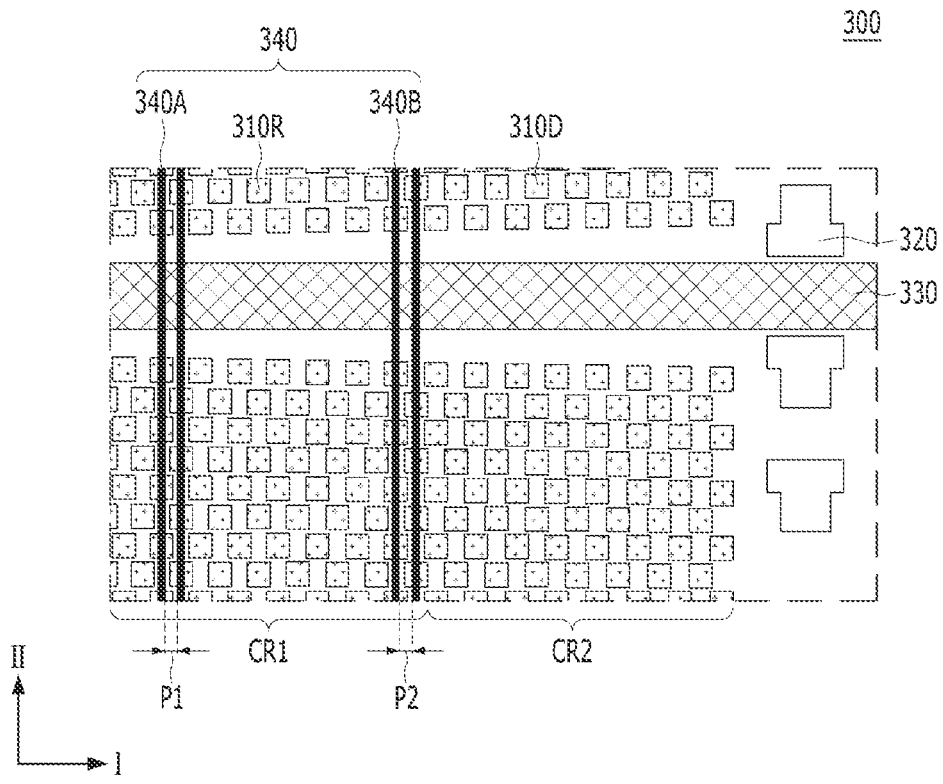
FIG. 4 is a diagram for describing a semiconductor device according to an embodiment of the present disclosure.

FIG. 4 is a diagram for describing a semiconductor device according to an embodiment of the present disclosure. Hereinafter, a description of contents that are redundant with aforementioned contents will be omitted.

Referring to FIG. 4, the semiconductor device may include a gate structure 300, first channel structures 310R, second channel structures 310D, or a slit structure 330 or may include the gate structure 300, the first channel structures 310R, the second channel structures 310D, or the slit structure 330 in combination. The semiconductor device may further include supports 320 or bit lines 340 or may further include the supports 320 or the bit lines 340 in combination.

The gate structure 300, the channel structures 310R and 310D, and the slit structure 330 may be the gate structure 100, the channel structures 110R and 110D, and the slit structure 130, respectively, which have been described with reference to FIGS. 1A to 1C. The channel structures 310R and 310D may be disposed in a cell region CR of the gate structure 300. For example, the first channel structures 310R may be disposed in a first region CR1 of the cell region CR. The second channel structures 310D may be disposed in a second region CR2 of the cell region CR.

The channel structures 310R and 310D may each be a real channel structure or a dummy channel structure. For example, the first channel structures 310R may each be a real channel structure, and the second channel structures 310D may each be a dummy channel structure. In this case, a distance between the first channel structures 310R and the slit structure 330 may be increased as the first channel structures 310R become closer to the contact region CTR. A distance between the second channel structures 310D and the slit structure 330 may be increased as the second channel structures 310D become closer to the contact region CTR.

The bit lines 340 may be disposed in the cell region CR of the gate structure 300. Furthermore, the bit lines 340 may be disposed on a real channel structure, and may be connected to the real channel structures. For example, the bit lines 340 may be connected to the first channel structures 310R. The bit lines 340 may extend in a second direction II that intersects a first direction I, and may be connected to the first channel structures 310R. The bit lines 340 may be disposed in the first direction I in a way to be spaced apart from each other.

An interval between the bit lines 340 may be increased as the bit lines 340 become closer to a contact region CTR. The bit lines 340 may include first bit lines 340A or second bit lines 340B. The second bit lines 340B may be disposed closer to the contact region CTR than the first bit lines 340A. The first bit lines 340A may be spaced apart from each other at a first interval P1 in the first direction I. The second bit lines 340B may be spaced apart from each other at a second interval P2 in the first direction I. The first interval P1 and the second interval P2 may be substantially the same or different from each other. For example, the second interval P2 may be greater than the first interval P1.

For reference, both the first channel structures 310R and the second channel structures 310D may each be a real channel structure. In this case, an interval between the bit lines 340 that are connected to the channel structures 310R and 310D may be increased as the bit lines 340 become closer to the contact region CTR.

According to an aforementioned structure, the intervals P1 and P2 between the bit lines 340 that are connected to the channel structures 310R and 310D may also be changed depending on distances between the channel structures 310R and 310D and the slit structure 330. The intervals P1 and P2 may be increased as the bit lines 340 become closer to the contact region CTR.

FIGS. 5A to 5D are diagrams for describing a method of manufacturing a semiconductor device according to an embodiment of the present disclosure. Hereinafter, a description of contents that are redundant with aforementioned contents will be omitted.

Figure 5A:
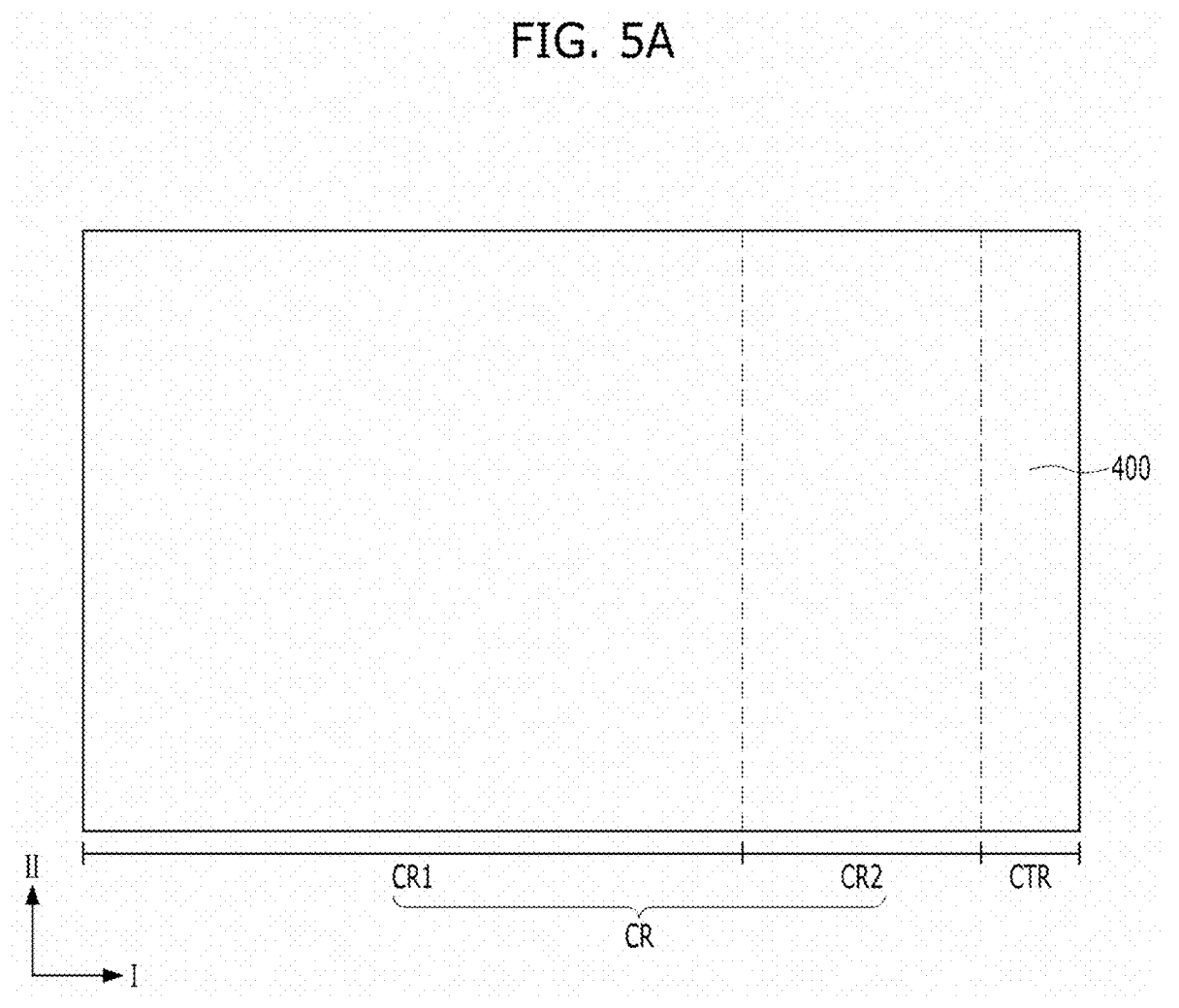

Referring to FIG. 5A, a stack 400 may be formed. The stack 400 may include first material layers and second material layers that are alternately stacked. In this case, the first material layers may include an insulating material, such as oxide. The second material layers may include a sacrificial material, such as nitride. Alternatively, the first material layers may include an insulating material, such as oxide. The second material layers may include a conductive material, such as tungsten. The stack 400 may include a cell region CR and a contact region CTR. The cell region CR may include a first region CR1 and a second region CR2. The second region CR2 may be disposed closer to the contact region CTR than the first region CR1.

Figure 5B:
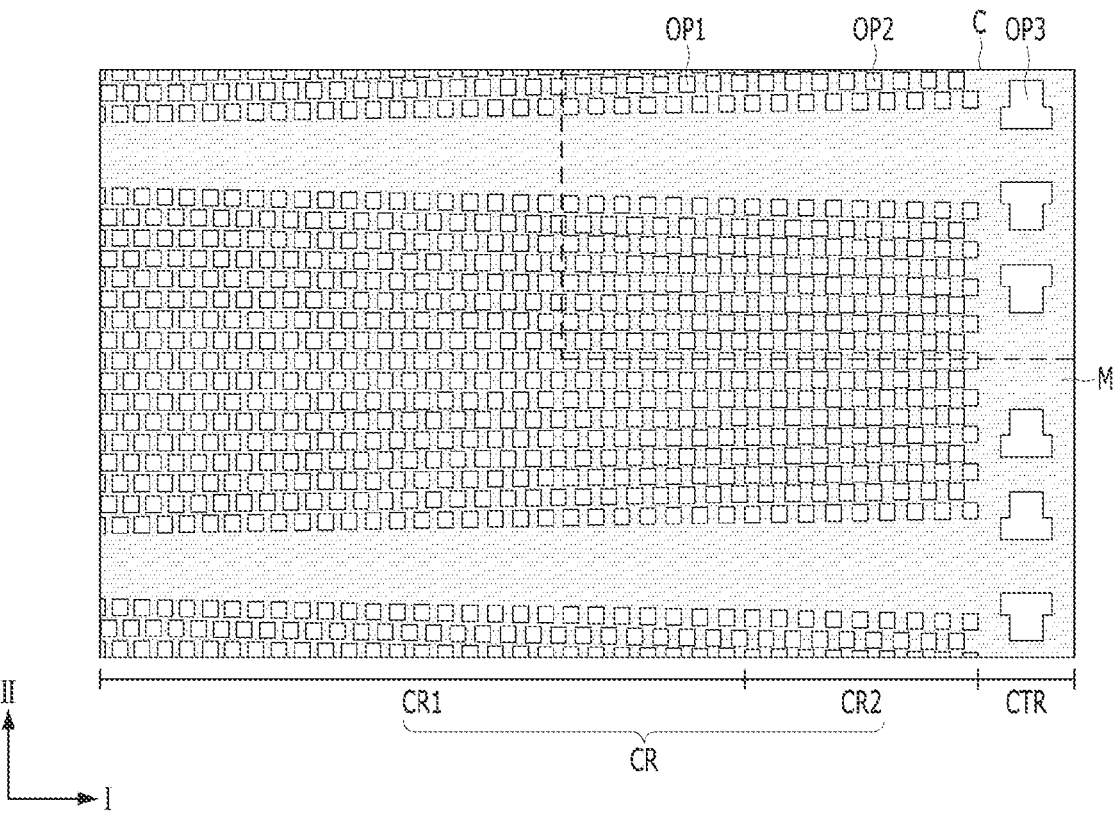
Figure 5C:
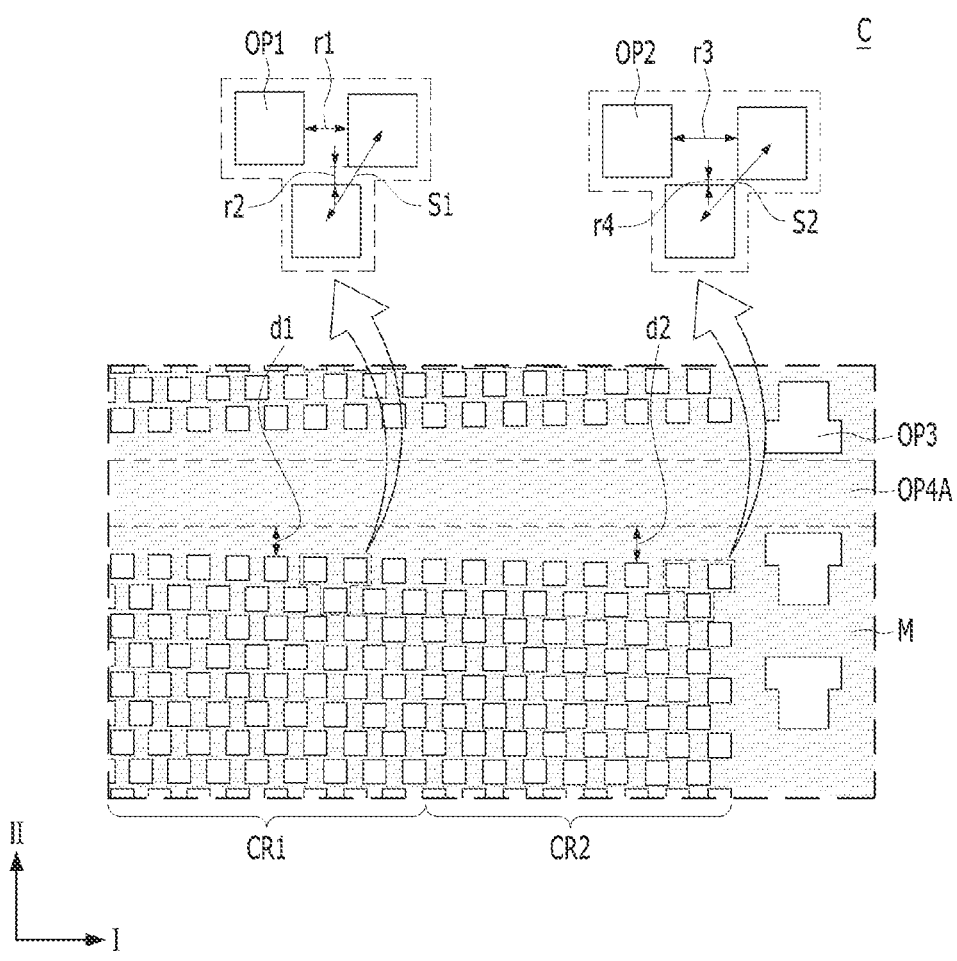

Referring to FIGS. 5B and 5C, a mask M may be formed on the stack 400. In this case, the mask M may include a hard mask or a photoresist or may include the hard mask or the photoresist in combination. Next, first openings OP1, second openings OP2, or third openings OP3 may be formed within the stack 400 or the first openings OP1, the second openings OP2, or the third openings OP3 may be formed in combination within the stack 400, by using the mask M as an etch barrier.

The first openings OP1 and the second openings OP2 may be formed in the cell region CR. The third openings OP3 may be formed in the contact region CTR. The first openings OP1 may be formed in the first region CR1. The second openings OP2 may be formed in the second region CR2. The first openings OP1, the second openings OP2, and the third openings OP3 may be simultaneously formed, but the present disclosure is not limited thereto. After the first openings OP1 and the second openings OP2 are formed, the third openings OP3 may be formed. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

An interval between the first openings OP1 or an interval between the second openings OP2 may be different depending on a distance from the contact region CTR. For example, an interval between the first openings OP1 in a first direction I and an interval between the second openings OP2 in the first direction I may be increased as the first openings OP1 and the second openings OP2 become closer to the contact region CTR. Furthermore, an interval between the first openings OP1 in a second direction II that intersects the first direction I and an interval between the second openings OP2 in the second direction II may be reduced as the first openings OP1 and the second openings OP2 become closer to the contact region CTR.

The first openings OP1 or the second openings OP2 may be formed by considering a region OP4A in which a fourth opening will be formed. The second openings OP2 may be disposed closer to the contact region CTR than the first openings OP1. The openings OP1 and OP2 may be formed so that distances between the openings OP1 and OP2 and the region OP4A in which the fourth opening will be formed are increased as the openings OP1 and OP2 become closer to the contact region CTR. For example, in the second direction II, the first openings OP1 may be formed to be spaced apart from the region OP4A in which the fourth opening will be formed by a first distance "d1". In the second direction II, the second openings OP2 may be formed to be spaced apart from the region OP4A in which the fourth opening will be formed by a second distance "d2". The first distance "d1" may be substantially the same as or different from the second distance "d2". For example, the second distance "d2" may be greater than the first distance "d1".

The first openings OP1 may be spaced apart from each other at a first interval "r1" in the first direction I, and may be spaced apart from each other at a second interval "r2" in the second direction II. The second openings OP2 may be spaced apart from each other at a third interval "r3" in the first direction I, and may be spaced apart from each other at a fourth interval "r4" in the second direction II. The first interval "r1" and the third interval "r3" may be substantially the same or different from each other. The second interval "r2" and the fourth interval "r4" may be substantially the same or different from each other.

The number of opening rows of the first openings OP1 and the number of opening rows of the second openings OP2 may be substantially the same or different from each other. In this case, the opening row may include the openings OP1 or OP2 that are arranged in the first direction I. If the second distance "d2" is greater than the first distance "d1", an interval between the opening rows of the second openings OP2 may be reduced. Accordingly, the fourth interval "r4" may be smaller than the second interval "r2".

Furthermore, in order to compensate for a difference between the pattern density of the first openings OP1 and the pattern density of the second openings OP2 according to a difference between the second interval "r2" and the fourth interval "r4", the third interval "r3" may be greater than the first interval "r1". Accordingly, a first diagonal line distance S1 between the first openings OP1 and a second diagonal line distance S2 between the second openings OP2 may be substantially the same. Furthermore, the pattern densities of the first openings OP1 and the second openings OP2 may be maintained substantially identically.

Figure 5D:
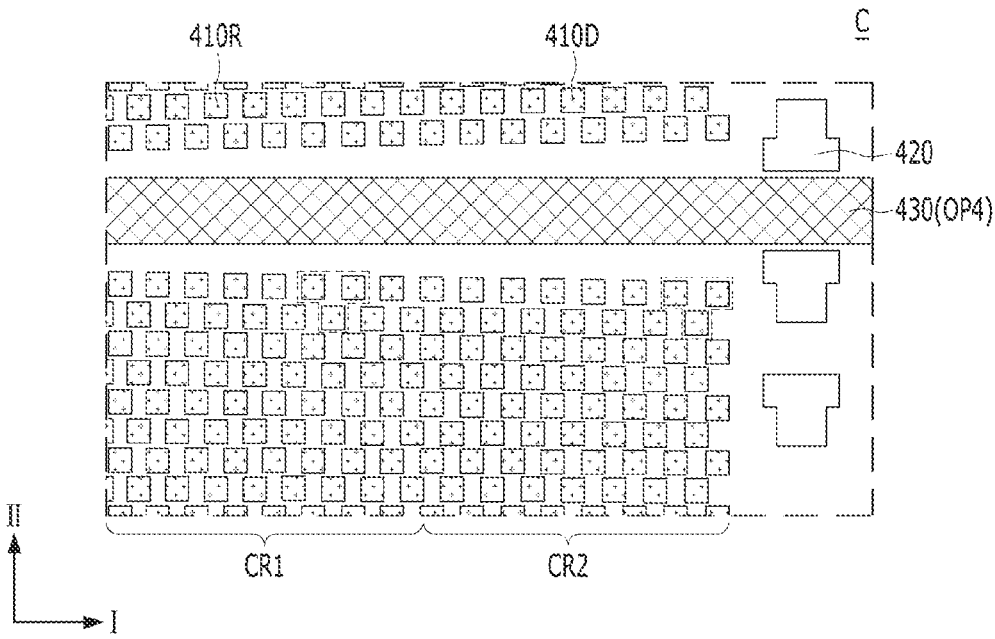

Referring to FIG. 5D, first channel structures 410R may be formed within the first openings OP1, respectively. Accordingly, the first channel structures 410R that extend through the stack 400 may be formed. Second channel structures 410D may be formed within the second openings OP2, respectively. Accordingly, the second channel structures 410D that extend through the stack 400 may be formed. The second channel structures 410D may be formed simultaneously with the first channel structures 410R, but the present disclosure is not limited thereto. After the first channel structures 410R are formed, the second channel structures 410D may be formed.

The channel structures 410R and 410D may be similar to the channel structures 110R and 110D, respectively, which have been described with reference to FIGS. 1A to 1C. The channel structures 410R and 410D may each include a channel layer, a memory layer, or an insulating core or may each include the channel layer, the memory layer, or the insulating core in combination.

The channel structures 410R and 410D may each be a real channel structure or a dummy channel structure. The real channel structure and the dummy channel structure may have similar structures. Electrical connection states of the real channel structure and the dummy channel structure may be different from each other. For example, the first channel structures 410R may each be a real channel structure. The second channel structures 410D may each be a dummy channel structure. As another example, the first channel structures 410R and the second channel structures 410D may each be a dummy channel structure.

Supports 420 may be formed within the third openings OP3, respectively. The supports 420 may be formed in the contact region CTR. The supports 420 may be simultaneously formed when the channel structures 410R and 410D are formed, but the present disclosure is not limited thereto. After the channel structures 410R and 410D are formed, the supports 420 may be formed.

Next, a fourth opening OP4 that extends in the first direction I may be formed within the stack 400. In this case, the fourth opening OP4 may be a slit. The fourth opening OP4 may be formed between the first channel structures 410R, between the second channel structures 410D, or between the supports 420 the first channel structures 410R, the second channel structures 410D, or the supports 420 being spaced apart from each other in the second direction II.

A form of the fourth opening OP4 may be influenced by a surrounding environment. If the pattern density of the cell region CR and the pattern density of the contact region CTR are different from each other, a form of the fourth opening OP4 may be deformed at a boundary between the cell region CR and the contact region CTR at which the pattern density is changed. For example, the fourth opening OP4 may have an inclined form, or some region of the fourth opening OP4 may protrude. In an embodiment, the fourth opening OP4 can be prevented from being inclined or deformed or the inclination or deformation of the fourth opening OP4 can be reduced because the openings OP1 and OP2 are formed by adjusting the distance between the fourth opening OP4 and the openings OP1 and OP2 so that the deformation of the fourth opening OP4 is minimized.

Next, a slit structure 430 may be formed within the fourth opening OP4. The relation between the intervals r1, r2, and S1 among the first openings OP1, the relation between the intervals r3, r4, and S2 among the second openings OP2, and the relation between the distances d1 and d2 between the openings OP1 and OP2 and the fourth opening OP4 may also be identically applied to a relation between the channel structures 410R and 410D and a relation between the channel structures 410R and 410D and the slit structure 430.

For reference, the gate structure may be formed within the stack 400 by replacing sacrificial materials with conductive layers. Furthermore, when the stack 400 is formed, if insulating layers and conductive layers are alternately stacked, a process of replacing the sacrificial materials may be omitted. Alternatively, a process for reducing resistance of the conductive layers, such as a silicidation process, may also be performed. In this case, the stack 400 may be a gate structure.

Furthermore, bit lines that are connected to real channel structures may be formed. For example, if the first channel structures 410R are real channel structures and the second channel structures 410D are dummy channel structures, bit lines that are connected to the first channel structures 410R may be formed. In this case, if a distance between the first channel structures 410R and the slit structure 430 is increased as the first channel structures 410R become closer to the contact region CTR, an interval between the bit lines may be increased.

According to an aforementioned process, locations of the openings OP1 and OP2 may be determined by considering a location at which the fourth opening OP4 will be formed. For example, the openings OP1 and OP2 may be formed so that the openings OP1 and OP2 become distant from locations at which the fourth opening OP4 will be formed as the openings OP1 and OP2 become closer to the contact region CTR. Accordingly, in an embodiment, a change in the form of the fourth opening OP4 can be prevented or minimized.

Figure 6A:
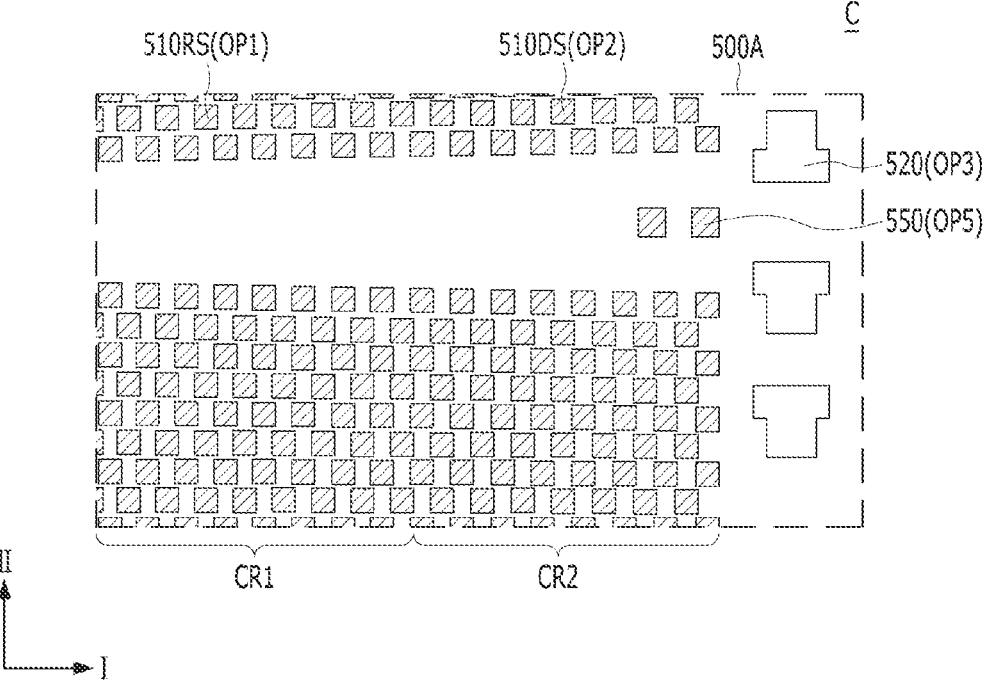
FIGS. 6A, 6B, and 6C are diagrams for describing a method of manufacturing a semiconductor device according to an embodiment of the present disclosure.
Figure 6B:
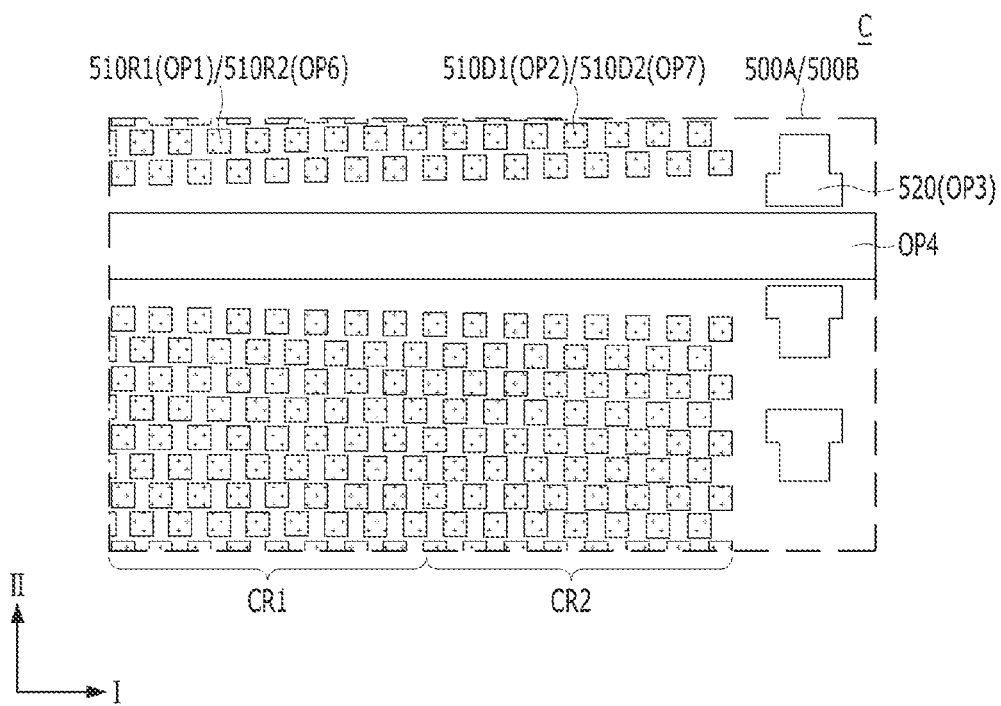
Figure 6C:
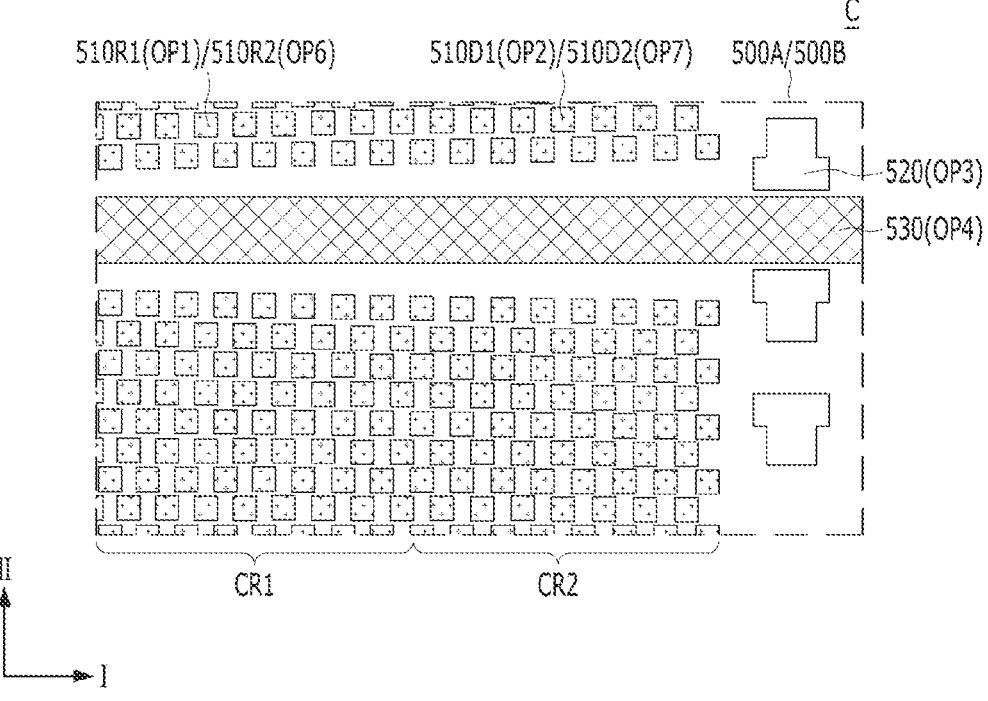

FIGS. 6A to 6C are diagrams for describing a method of manufacturing a semiconductor device according to an embodiment of the present disclosure. Hereinafter, a description of contents that are redundant with aforementioned contents will be omitted.

Referring to FIG. 6A, dummy plugs 550 may be formed within a first stack 500A. First, fifth openings OP5 may be formed within the first stack 500A. In this case, the fifth openings OP5 may each be a dummy opening. The fifth openings OP5 may be formed when first openings OP1 and second openings OP2 are formed. The fifth openings OP5 may be formed in a location at which a fourth opening OP4 will be formed. In other words, a dummy opening may be formed at a location at which a slit will be formed.

The first openings OP1 and the second openings OP2 may be the same as the first openings OP1 and the second openings OP2 that have been described with reference to FIGS. 5B to 5D. The first openings OP1 and the second openings OP2 may be formed by considering the location at which the fourth opening OP4 will be formed. For example, the openings OP1 and OP2 may be formed so that the openings OP1 and OP2 become distant from the location at which the fourth opening OP4 will be formed as the openings OP1 and OP2 become closer to the contact region CTR.

Next, the dummy plugs 550 may be formed within the fifth openings OP5, respectively. The dummy plugs 550 may be formed when sacrificial layers 510RS and 510DS are formed within the openings OP1 and OP2, respectively. The sacrificial layers 510RS and 510DS may include a material that has high etch selectivity to the stack. For example, the sacrificial layers 510RS and 510DS may include a conductive material, such as tungsten. The dummy plugs 550 may be formed of the same material as the sacrificial layers 510RS and 510DS. For example, the dummy plugs 550 may include a conductive material, such as tungsten.

Referring to FIGS. 6B and 6C, a second stack 500B may be formed on the first stack 500A. Next, sixth openings OP6 that are connected to the first openings OP1 may be formed within the second stack 500B. Seventh openings OP7 that are connected to the second openings OP2 may be formed within the second stack 500B. For example, the openings OP6 and OP7 that expose the channel structures 510R1 and 510D1, respectively, may be formed. The openings OP6 and OP7 may be formed by considering the location at which the fourth opening OP4 will be formed. For example, the openings OP6 and OP7 may be formed so that the openings OP6 and OP7 become distant from the location at which the fourth opening OP4 will be formed as the openings OP6 and OP7 become closer to the contact region CTR. For reference, although not illustrated in these drawings, the second stack 500B may be formed so that a distance between the fourth opening OP4 and the openings OP6 and OP7 is constant.

Next, the first openings OP1 may be re-opened by removing the sacrificial layers 510RS within the first openings OP1 through the sixth openings OP6. The second openings OP2 may be re-opened by removing the sacrificial layers 510DS within the second openings OP2 through the seventh openings OP7. Next, channel structures 510R1, 510R2, 510D1, and 510D2 may be formed within the openings OP1, OP6, OP2, and OP7, respectively. For example, the first channel structures 510R1 and the third channel structures 510R2 may be formed within the sixth openings OP6 and the first openings OP1, respectively. The second channel structures 510D1 and the fourth channel structures 510D2 may be formed within the seventh openings OP7 and the second openings OP2. In this case, referring back to FIG. 2B, the first channel structures 510R1 and the third channel structures 510R2 may be aligned and connected, and the second channel structures 510D1 and the fourth channel structures 510D2 may be aligned and connected.

For reference, the channel structures 510R1, 510R2, 510D1, and 510D2 may be offset and disposed. For example, referring back to FIG. 3C, the first channel structures 510R1 and the third channel structures 510R2 may be offset and connected. Referring back to FIG. 3D, that is, the sacrificial layers 510RS and 510DS may be disposed within the first stack 500A instead of the first channel structures 510R1 and the second channel structures 510D1. The sacrificial layers 510RS and 510DS may be offset and disposed so that the sacrificial layers 510RS and 510DS do not overlap the third channel structure 510R2 and the fourth channel structure 510D2. The sacrificial layers 510RS and 510DS may remain without being replaced with the first channel structure 510R1 or the second channel structure 510D2 in a process of manufacturing the semiconductor device.

Next, the fourth opening OP4 may be formed. When the fourth opening OP4 is formed, charges may be discharged through the dummy plug 550. For example, charges that have been accumulated within the channel structures 510R1, 510R2, 510D1, and 510D2 may be discharged through the dummy plug 550. The dummy plug 550 may be removed in a process of forming the fourth opening OP4. Next, a slit structure 530 may be formed within the fourth opening OP4.

According to an aforementioned process, the dummy plug 550 may be formed within the first stack 500A before the second stack 500B is formed. Accordingly, in a process of forming the fourth opening OP4, charges that have been accumulated within the channel structures 510R1, 510R2, 510D1, and 510D2 can be discharged through the dummy plug 550. In an embodiment, the deformation of the fourth opening OP4 attributable to the charges can be prevented or minimized.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

16

What is claimed is:

1. A semiconductor device comprising:
a gate structure comprising a cell region and a contact region;
a slit structure configured to extend in a first direction through the gate structure;
first channel structures disposed in the cell region of the gate structure; and
second channel structures disposed in the cell region of the gate structure and disposed to be more adjacent to the contact region of the gate structure than the first channel structures,
wherein in a second direction that intersects the first direction, the first channel structures are spaced apart from the slit structure by a first distance, and the second channel structures are spaced apart from the slit structure at a second distance, the second distance is greater than the first distance.

2. The semiconductor device of claim 1, wherein:
the first channel structures are spaced apart from each other at a first interval in the first direction and are spaced apart from each other at a second interval in the second direction,
the second channel structures are spaced apart from each other at a third interval in the first direction and are spaced apart from each other at a fourth interval in the second direction,
the third interval is greater than the first interval, and the fourth interval is less than the second interval.

3. The semiconductor device of claim 1, wherein a pattern density of the first channel structures and a pattern density of the second channel structures are substantially the same as each other.

4. The semiconductor device of claim 1, wherein a first diagonal line distance between the first channel structures and a second diagonal line distance between the second channel structures are substantially the same as each other.

5. The semiconductor device of claim 1, wherein the first channel structures and the second channel structures each comprise a dummy channel structure.

6. The semiconductor device of claim 1, wherein:
the first channel structures each comprise a real channel structure, and
the second channel structures each comprise a dummy channel structure.

7. The semiconductor device of claim 6, wherein:
a distance between the first channel structures and the slit structure is substantially the same, and
a distance between the second channel structures and the slit structure is increased as the second channel structures become closer to the contact region.

8. The semiconductor device of claim 6, wherein a distance between the first channel structures and the slit structure is increased as the first channel structures become closer to the contact region.

9. The semiconductor device of claim 1, further comprising bit lines connected to the first channel structures and configured to extend in the second direction,
wherein an interval between the bit lines is increased as the bit lines become closer to the contact region.

10. A semiconductor device comprising:
a first gate structure comprising a cell region and a contact region;
first channel structures and second channel structures disposed in the cell region of the first gate structure;
a second gate structure disposed on the first gate structure;
third channel structures disposed within the second gate structure and connected to the first channel structures;

fourth channel structures disposed within the second gate structure and connected to the second channel structures; and a slit structure disposed within the first gate structure and the second gate structure and configured to extend in a first direction, wherein in a second direction that intersects the first direction, the first channel structures are spaced apart from the slit structure by a first distance, and the second channel structures are spaced apart from the slit structure by a second distance that is greater than the first distance.

11. The semiconductor device of claim 10, wherein in the second direction, the third channel structures are spaced apart from the slit structure by a third distance, and the fourth channel structures are spaced apart from the slit structure by a fourth distance that is greater than the third distance.

12. The semiconductor device of claim 10, wherein:

in the second direction, the fourth channel structures are spaced apart from the slit structure by a fourth distance, and the fourth distance is smaller than the second distance.

13. The semiconductor device of claim 10, wherein:

the third channel structures are spaced apart from each other at a first interval in the first direction and are spaced apart from each other at a second interval in the second direction, the fourth channel structures are spaced apart from each other at a third interval in the first direction and are spaced apart from each other at a fourth interval in the second direction, the third interval is greater than the first interval, and the fourth interval is less than the second interval.

14. The semiconductor device of claim 10, wherein a pattern density of the third channel structures and a pattern density of the fourth channel structures are substantially the same as each other.

15. The semiconductor device of claim 10, wherein:

the fourth channel structures are disposed to be more adjacent to the contact region than the third channel structures, a distance between the third channel structures and the slit structure is substantially identical, and a distance between the fourth channel structures and the slit structure is increased as the fourth channel structures become closer to the contact region.

16. The semiconductor device of claim 15, wherein the distance between the third channel structures and the slit structure is increased as the third channel structures become closer to the contact region.

* * * * *